United States Patent
Hohage et al.

(10) Patent No.: US 8,211,795 B2
(45) Date of Patent: Jul. 3, 2012

(54) METHOD OF FORMING A DIELECTRIC CAP LAYER FOR A COPPER METALLIZATION BY USING A HYDROGEN BASED THERMAL-CHEMICAL TREATMENT

(75) Inventors: Joerg Hohage, Dresden (DE); Volker Kahlert, Dresden (DE); Hartmut Ruelke, Dresden (DE); Ulrich Mayer, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 607 days.

(21) Appl. No.: 11/970,876

(22) Filed: Jan. 8, 2008

(65) Prior Publication Data
US 2008/0286966 A1 Nov. 20, 2008

(30) Foreign Application Priority Data

May 15, 2007 (DE) .......................... 10 2007 022 621

(51) Int. Cl.
*H01L 21/44* (2006.01)
(52) U.S. Cl. ................ 438/653; 257/E21.476; 438/652; 438/683; 438/687
(58) Field of Classification Search .................. 438/652, 438/653, 683, 687
See application file for complete search history.

(56) References Cited

U.S. PATENT DOCUMENTS

| 5,447,887 A | 9/1995 | Filipiak et al. ................ 437/200 |
| 6,046,108 A | 4/2000 | Liu et al. ........................ 438/687 |
| 6,518,184 B1 | 2/2003 | Chambers et al. ............. 438/687 |
| 7,262,133 B2 * | 8/2007 | Chen et al. ..................... 438/687 |
| 2003/0089992 A1 * | 5/2003 | Rathi et al. ..................... 438/687 |
| 2006/0046479 A1 * | 3/2006 | Rajagopalan et al. ......... 438/683 |
| 2006/0099804 A1 | 5/2006 | Ramappa et al. ............. 438/652 |
| 2006/0189133 A1 | 8/2006 | Dimitrakopoulos et al. . 438/687 |

OTHER PUBLICATIONS

Communication from foreign associate dated May 13, 2008.
Translation of Official Communication issued Mar. 17, 2008.

* cited by examiner

*Primary Examiner* — David Vu
*Assistant Examiner* — Jonathan Han
(74) *Attorney, Agent, or Firm* — Williams, Morgan & Amerson

(57) ABSTRACT

A new technique is disclosed in which a barrier/cap layer for a copper based metal line is formed by using a thermal-chemical treatment based on hydrogen with a surface modification on the basis of a silicon-containing precursor followed by an in situ plasma based deposition of silicon based dielectric barrier material. The thermal-chemical cleaning process is performed in the absence of any plasma ambient.

22 Claims, 4 Drawing Sheets

METHOD OF FORMING A DIELECTRIC CAP LAYER FOR A COPPER METALLIZATION BY USING A HYDROGEN BASED THERMAL-CHEMICAL TREATMENT

BACKGROUND OF THE INVENTION

1. Field of the Invention

Generally, the present disclosure relates to the formation of integrated circuits, and, more particularly, to the formation of metallization layers including highly conductive metals, such as copper, embedded into a dielectric material including a cap layer acting as an efficient diffusion barrier layer for the metal.

2. Description of the Related Art

In modern integrated circuits, minimum feature sizes, such as the channel length of field effect transistors, have reached the deep sub-micron range, thereby steadily increasing performance of these circuits in terms of speed and/or power consumption. As the size of the individual circuit elements is significantly reduced, thereby improving, for example, the switching speed of the transistor elements, the available floor space for interconnect lines electrically connecting the individual circuit elements is also decreased. Consequently, the dimensions of these interconnect lines have to be reduced to compensate for a reduced amount of available floor space and for an increased number of circuit elements provided per chip.

In integrated circuits having minimum dimensions of approximately 0.35 µm and less, a limiting factor of device performance is the signal propagation delay caused by the switching speed of the transistor elements. As the channel length of these transistor elements has now reached 0.1 µm and significantly less, it turns out, however, that the signal propagation delay is no longer limited by the field effect transistors but is limited, owing to the increased circuit density, by the interconnect lines, since the parasitic line-to-line capacitance (C) is increased and the conductivity (1/R) of the lines is reduced due to their reduced cross-sectional area. The parasitic RC time constants therefore require the introduction of a new type of materials for forming the metallization layers of advanced semiconductor devices.

Traditionally, metallization layers have been and still are formed by a dielectric layer stack including, for example, silicon dioxide and/or silicon nitride with aluminum as the typical metal. Since aluminum exhibits significant electromigration at higher current densities than may be necessary in integrated circuits having extremely scaled feature sizes, aluminum is being replaced by copper, which has a significantly lower electrical resistance and a higher resistivity against electromigration. For highly sophisticated applications, in addition to using copper and/or copper alloys, the well-established and well-known dielectric materials silicon dioxide ($k \approx 4.2$) and silicon nitride ($k > 5$) may be replaced by so-called low-k dielectric materials. However, the transition from the well-known and well-established aluminum/silicon dioxide metallization layer to a copper-based metallization layer, possibly in combination with a low-k dielectric material, is associated with a plurality of issues to be dealt with.

For example, copper may not be deposited in relatively high amounts in an efficient manner by well-established deposition methods, such as chemical and physical vapor deposition. Moreover, copper may not be efficiently patterned by well-established anisotropic etch processes. Therefore, the so-called damascene or inlaid technique is frequently employed in forming metallization layers including copper lines. Typically, in the damascene technique, the dielectric layer is deposited and then patterned to receive trenches and vias that are subsequently filled with copper or alloys thereof by plating methods, such as electroplating or electroless plating. Forming copper-based metallization layers in standard dielectric materials, such as silicon dioxide, and a plurality of low-k dielectrics is presently frequently being practiced by providing a dielectric diffusion barrier layer on top of the copper-based region as copper readily diffuses in a plurality of dielectrics, such as silicon dioxide and many low-k dielectrics. Moreover, the diffusion of moisture and oxygen into the copper-based metal has to be suppressed as copper readily reacts to form oxidized portions, thereby possibly deteriorating the characteristics of the copper-based metal line with respect to adhesion, conductivity and the resistance against electromigration. For instance, silicon nitride is known as an effective copper diffusion barrier and may be used as a cap layer. In other cases, when the moderately high permittivity of silicon nitride is considered inappropriate, nitrogen enriched silicon carbide (SiCN) is frequently used as a copper diffusion barrier.

Despite the diffusion hindering effect of the silicon nitride cap layers and silicon carbide based cap layers, it turns out, however, that copper's resistance against electric current induced material transport (electromigration) strongly depends on the characteristics of an interface between the copper-based metal and the adjacent cap layer. Electromigration is a phenomenon that mainly occurs in highly scaled electronic devices having metal lines which are embedded into a dielectric material, thereby providing a high heat dissipation capability and thus the possibility to operate at extremely high current densities of up to several kA per $cm^2$. At respective high current densities, the directed electron motion of the current flow may result in a significant momentum transfer to the metal atoms, thereby generating a mass flow in the direction of the moving electrons, which may finally cause voids and hillocks upstream and downstream, respectively, of respective metal areas. Hence, the lifetime of semiconductors may strongly depend on the electromigration behavior of the metallization structure of the device. Generally, it would be possible to form virtually "immortal" metallization structures, which would, however, significantly reduce design flexibility and also scalability of modern semiconductor devices. The general trend in the market of electronic devices, however, demands reduced device dimensions and increased performance, thereby rendering the increase of the resistance against electromigration induced line degradation an important factor for forming advanced semiconductor devices. Since electromigration is an interaction of electrons and metal atoms, which results in a directed "diffusion" of metal atoms, the number and quality of the metal internal diffusion paths, such as grain boundaries, and in particular the diffusion paths at interfaces may strongly affect the overall electromigration performance of metallization structures. Hence, it is important to create stable interfaces when confining the metal, such as copper and copper alloys, by appropriate barrier materials. Therefore, in sophisticated integrated circuits featuring high current densities, it is generally preferable to design the deposition process for the capping layer such that a desired high adhesion and thus high performance with respect to electromigration is achieved. For this purpose, corresponding deposition techniques with preceding plasma-based cleaning steps are typically used. With reference to FIGS. 1a-1b, a typical conventional process flow for forming a SiCN cap layer will now be described in more detail.

FIG. 1a schematically shows a cross-sectional view of a semiconductor device 100 prior to the formation of a silicon nitride or a nitrogen enriched silicon carbide based cap layer on a copper-containing metal region. The semiconductor device 100 comprises a substrate 101 that may include circuit elements, such as transistors, capacitors and the like, which for convenience are not shown. Moreover, the substrate may have formed thereon one or more metallization layers, i.e., dielectric layers in which are embedded metal filled lines and vias so as to establish the required electrical connections between the individual circuit elements. For convenience, a single copper based metal region 103 is illustrated so as to represent any copper based metal lines of one or more metallization layers. The copper based metal region 103 may be embedded in any appropriate dielectric material, such as silicon dioxide, fluorine doped silicon dioxide, a low-k material such as hydrogen enriched silicon oxycarbide (SiCOH), or any combination thereof. As previously explained, the copper may readily diffuse in a plurality of dielectric materials and hence a conductive barrier layer 102 is typically provided between the dielectric material of the substrate 101 and the copper-containing material of the region 103. The barrier layer 102 may be comprised of two or more individual layers so as to provide the required characteristics not only in view of the copper diffusion blocking effect, but also with respect to adhesion to the surrounding material and the like. For example, tantalum, tantalum nitride, titanium, titanium nitride and combinations thereof are frequently used as appropriate materials for the barrier layer 102.

A typical process flow for forming the semiconductor device 100 as shown in Figure may comprise the following processes. After the formation of any circuit elements, which may exhibit extremely scaled critical dimensions in sophisticated applications, such as a gate length of field effect transistors in the range of approximately 50-100 nm and less, one or more metallization layers may be formed in accordance with well-established single damascene or dual damascene techniques. That is, an appropriate dielectric layer stack including an etch stop/barrier layer similar to the cap layer that is to be formed on top of the copper based metal region 103 may be deposited followed by another dielectric layer, such as silicon dioxide or a low-k dielectric material, which may be formed by well-established techniques, such as plasma enhanced chemical vapor deposition (PECVD), spin-on techniques and the like. Thereafter, the dielectric layer stack may be patterned by photolithography and etch techniques to form trenches and vias in the dielectric layer stack, wherein the lower etch stop/barrier or cap layer (not shown) may be used as an etch stop. For convenience, only a single trench may be considered for the further description, in which the copper based metal region 103 is to be formed. Thus, after the patterning of the corresponding trench, the barrier layer 102 may be deposited on the basis of well-established deposition techniques, such as sputter deposition, chemical vapor deposition (CVD), atomic layer deposition (ALD) and the like. For instance, well-established recipes for the sputter deposition of tantalum and tantalum nitride as well as titanium and titanium nitride may be used to form the barrier layer 102 having the desired characteristics. Thereafter, a seed layer (not shown) comprised of, for instance, copper may be formed by sputter deposition or any other appropriate deposition technique. Based on the seed layer, a copper based material, such as pure copper, a copper alloy or any combination thereof, may be deposited by, for instance, electroplating, thereby reliably filling the previously formed trenches and vias and also forming the copper based metal region 103. Next, excess material deposited during the preceding electrochemical deposition process, as well as the seed layer and the conductive barrier layer 102 formed on portions outside the copper based metal region 103, may be removed to provide the electrically insulated copper based metal region 103. For this purpose, a removal process typically comprising a chemical mechanical polishing (CMP) process may be performed, during which a surface 103A of the region 103 is exposed, which may thus be subjected to any chemical reactions, resulting in discolored and eroded or oxidized portions on the surface 103A, since copper may readily react with moisture, oxygen, fluorine and other traces of gases that may typically be encountered during the removal of the excess material and subsequent substrate handling processes. Consequently, prior to the formation of an insulating cap layer, which may also act as an etch stop layer for the formation of any further metallization layers on top of the substrate 101, the surface 103A is typically cleaned in order to enhance conductivity and the adhesion characteristics and thus the electromigration behavior of the region 103 due to enhanced interface characteristics with respect to a dielectric cap material still to be formed. To this end, a plasma based treatment may be performed to efficiently remove oxidized, discolored and eroded portions from the surface 103A while at the same time substantially avoiding a reformation of these portions. For example, a plasma ambient 104 may be established on the basis of ammonia ($NH_3$) and nitrogen ($N_2$), wherein the plasma ignition is typically performed on the basis of radio frequency (RF), the power density of which may significantly determine, in combination with the gas flows of ammonia and nitrogen, the effectiveness of the plasma treatment 104. For instance, with appropriately selected gas flows in the range of approximately 500-600 sccm (standard cubic centimeter per minute) and 6000 sccm for ammonia and nitrogen, respectively, and an RF power of 200 watts for a plasma deposition chamber, such as the Producer™ available from Applied Materials Corporation, a good adhesion for a nitrogen enriched silicon carbide (SiCN) layer may be obtained. After the plasma treatment 104, the ambient may be changed by applying appropriate precursor materials so that an appropriate deposition atmosphere may be established in situ, thereby avoiding undue discoloration and oxidation on the exposed surface 103A. After a corresponding stabilization step for introducing the precursor gases, such as 3MS (tri-methylsilane) and ammonia for forming a nitrogen enriched silicon carbide layer, an appropriate RF power may be supplied to establish a corresponding plasma, thereby initiating the deposition process.

FIG. 1b schematically shows the semiconductor device 100 during this deposition step, wherein, on the basis of the plasma 105 containing 3MS, $NH_3$ and He, a cap layer 106 comprised of nitrogen enriched silicon carbide (SiCN) is formed above the substrate 101 and on the exposed surface 103A, thereby creating a corresponding interface, which is, for convenience, also referred to as 103A. Thereafter, further processing may be continued by forming further metallization layers, wherein the cap layer 106 may act as an etch stop layer for patterning a corresponding dielectric layer stack for forming corresponding vias and trenches.

During the operation of the device 100, the current-induced material transport, also referred to as electromigration, at the interface 103A may nevertheless reach critical values, especially when a copper based metal region 103 is part of a higher metallization layer. Thus, for sophisticated applications requiring increased current densities, it has been proposed to form an increased amount of copper silicide based compounds (CuSi) at the interface with the following dielectric barrier material, since the CuSi may provide enhanced electromigration behavior. However, the controlled creation of CuSi prior to the actual deposition of SiC, SiCN, SiN in situ based on respective efficient plasma-based cleaning processes may be difficult, since the silicon-containing precursor gases may diffuse in a very uncontrolled manner into the copper-containing metal after the plasma cleaning process, in particular at temperatures above 300° C. as are usually used for the deposition, thereby resulting in a substantially non-controllable formation of CuSi, which may have a negative impact on the electrical performance and uniformity during operation of the metallization structure.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to a technique that enables the formation of an insulating, i.e., dielectric, barrier or cap layer for a copper based metal region, wherein an exposed surface of the copper-containing region is pre-treated on the basis of a thermal-chemical reaction using hydrogen rather than a plasma treatment, thereby significantly improving the interface between the exposed copper-containing surface and a subsequently in situ deposited dielectric cap layer. The hydrogen based thermal-chemical cleaning treatment may efficiently remove contaminants, such as oxidized portions, while creating a significantly reduced amount of surface damage, as may be observed during plasma-based cleaning processes. Additionally, the hydrogen based thermal-chemical treatment is highly selective with respect to the surrounding dielectric material, such as a low-k material in the form of porous ultra low-k dielectrics and the like, as, for instance, the carbon depletion in these materials may be reduced compared to conventional plasma-based treatments. Moreover, a surface modification of the chemically cleaned copper surface may be generated on the basis of a silicon-containing precursor, which may, in some embodiments, comprise at least one of 4MS (tetra-methyl silane), 3MS (tri-methyl silane) and silane ($SiH_4$), for creating a CuSi compound as an intermediate stage, wherein this copper silicide formation process is well controllable due to the preceding hydrogen based cleaning process. Hence, a reinforced surface and, after deposition of the barrier material, an enhanced interface between copper based metal and the dielectric material may be obtained with good controllability of the final sheet resistance at this interface. Consequently, improved characteristics with respect to, for instance, electromigration may be achieved, while on the other hand a significantly reduced process time is obtained compared to conventional cap layers manufactured by using a plasma-treated copper surface.

One illustrative method disclosed herein comprises forming a copper based metal region in a dielectric layer of a metallization layer of a semiconductor device, wherein the copper based metal region has an exposed surface. Moreover, the exposed surface is cleaned by means of a thermal-chemical treatment in a hydrogen-containing gaseous ambient. Then, the cleaned surface is modified by a thermal treatment on the basis of a silicon-containing precursor. Finally, a cap layer is deposited on the exposed surface.

Another illustrative method disclosed herein relates to forming a dielectric cap layer in situ, wherein the illustrative method comprises cleaning an exposed surface of a copper based metal region in a dielectric layer of a metallization layer of a semiconductor device by means of a thermal-chemical treatment performed in a hydrogen-containing gaseous ambient. The method further comprises modifying the cleaned surface in a thermal treatment on the basis of a silicon-containing precursor and establishing a pre-deposition ambient including a silicon-containing precursor gas in the absence of a plasma. Finally, the method comprises depositing the dielectric cap layer on the modified surface in the pre-deposition ambient by generating a plasma therein.

Yet another illustrative method disclosed herein comprises providing a semiconductor device comprising a substrate having formed thereon a copper based metal region having an exposed surface. Furthermore, the exposed surface is pre-treated in the absence of a plasma ambient to prepare the exposed surface for receiving a cap layer thereon, wherein the pre-treatment comprises a surface cleaning process in a hydrogen-containing gaseous ambient and a surface modification process on the basis of a silicon-containing precursor. Finally, the cap layer is deposited in situ in the presence of a deposition plasma ambient.

BRIEF DESCRIPTION OF THE DRAWINGS

The disclosure may be understood by reference to the following description taken in conjunction with the accompanying drawings, in which like reference numerals identify like elements, and in which.

Figure 1A:
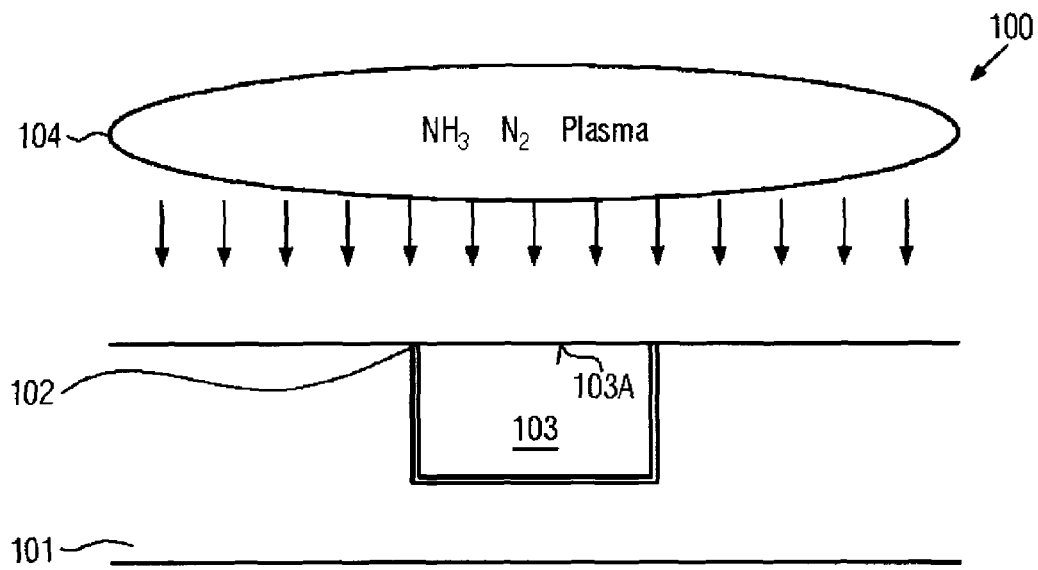
FIGS. 1a-1b schematically show cross sectional views of a conventional semiconductor device during the formation of a nitrogen enriched silicon carbide (SiCN) cap layer, wherein an exposed copper surface is pre-cleaned by means of a plasma treatment.
Figure 1B:
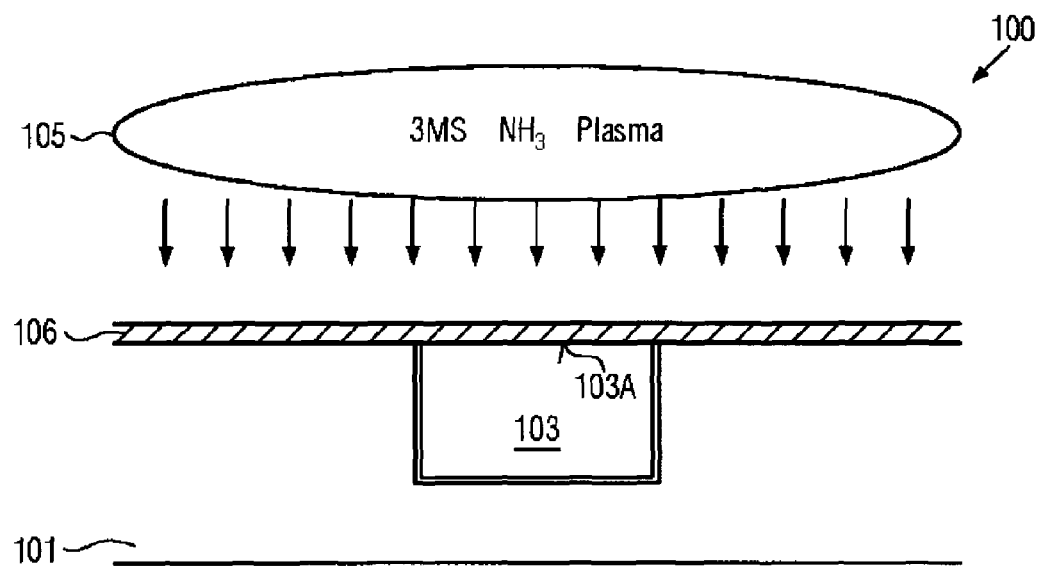

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein contemplates a new technique for the formation of a dielectric barrier or cap layer for exposed copper based metal regions, such as metal lines as are typically used in sophisticated semiconductors including copper based metallization layers, in combination with low-k dielectric materials, wherein moderately high current densities and operating temperatures may be encountered in the metal lines during the operation of the devices. As previously explained, stress-induced material transport phenomena in conductive lines may significantly influence the overall reliability and lifetime of semiconductor devices as the failure of even one single conductive line within the metallization layer may cause a failure of the device or may at least reduce the reliability thereof. Material transport in metal lines, such as electromigration, which describes the phenomenon of copper diffusion induced by an electric current in a metal line, thus creating voids and hillocks in the metal line, may significantly depend on the characteristics of diffusion paths that are typically formed at interfaces between two different material layers. Recent investigation seems to confirm that the characteristics of the interface between copper based metal and the cap layer, which is typically based on silicon and/or carbon and/or nitrogen, may have a strong influence on the copper based metal line's resistance against electromigration. Thus, conventionally, the exposed copper based surface is cleaned by a plasma treatment prior to the actual deposition so as to efficiently remove copper oxide in order to achieve good adhesion on copper. For instance, the coefficient $G_c$ indicating the adhesion "strength" of a material on a substrate is greater than 20 $J/m^2$ for a typical conventional silicon carbon nitride capping layer formed on the basis of a plasma based cleaning treatment. However, as previously noted, the electromigration at a copper/SiCN interface can nevertheless reach critical values, especially in higher metallization levels, thereby rendering a corresponding metallization less reliable for highly sophisticated applications. Moreover, a silicon nitride layer may not be a desirable alternative in conventional techniques, since a conventional ammonia/nitrogen based plasma pre-treatment is critical, as silane, i.e., the precursor of the silicon nitride deposition process, may readily diffuse into the plasma cleaned copper surface, which is also heated by the interaction with the plasma, thereby resulting in a copper silicide formation that may not be controlled and thus significantly affect the resulting characteristics of the cap layer/copper interface in a non-predictable manner.

According to the principles of the present disclosure, the pre-treatment of the exposed copper based surface is performed in the absence of a plasma ambient by using a hydrogen-containing ambient, thereby resulting in a highly efficiently cleaned copper surface with a significantly reduced amount of surface irregularities of the exposed copper based surface, such as hillocks and voids and the like. Additionally, damage of sensitive device surfaces, such as exposed low-k materials, may be reduced. For instance, the carbon depletion of respective low-k materials and ultra low-k materials including porous dielectrics, which may typically occur in conventional plasma-based pre-treatments, may be reduced, thereby contributing to increased reliability of the metallization layers under consideration. Moreover, a well-controllable surface modification that is thermally driven may be initiated on the basis of a silicon-containing precursor, such as silane, 3MS, 4MS and the like, wherein the missing plasma, i.e., RF power coupled into the surface region in conventional techniques, enables a control of the silane diffusion and thus of the generation of copper silicide and nitrogen-containing copper silicide in the copper surface, which may then provide enhanced interface characteristics with the cap layer deposited subsequently.

In this respect, the term "in the absence of a plasma ambient" is to be understood such that the hydrogen based treatment is performed substantially on the basis of a chemical reaction, which is thermally activated by the heated surface, in a gaseous environment, wherein the hydrogen-containing gas components have a non-directional thermal motion, possibly with a fraction of ionized particles that corresponds to the fraction created by the mutual interaction of the gaseous components without applying an external electromagnetic field. Thus, "in the absence of a plasma ambient" is to be understood such that plasma-induced effects, if any external electromagnetic fields are present in the gaseous hydrogen-containing environment surrounding the exposed copper based surface, such as plasma-induced ion bombardment, substrate charging and the like, are negligible compared to the pure thermal-chemical effect caused by components of the hydrogen-containing gaseous environment.

In some aspects, the cleaning of the exposed copper based surface using a hydrogen thermal-chemical treatment is followed by the modification of the surface using a silicon-containing precursor material, and then a process for establishing a pre-deposition ambient is performed prior to actually creating a plasma for the deposition of the cap layer material. Establishing the pre-deposition ambient may enable defining well-controllable process conditions and thus diffusion conditions for the creation of a copper silicon compound prior to preparing the actual deposition ambient on the basis of a plasma. In some illustrative methods, this may include the discontinuation of supply of process gases and pumping off of gases, followed by the supply of process gases as required for the subsequent deposition. In other illustrative embodiments, the pump step may be omitted and the process gases for the deposition may be supplied after discontinuing the supply of hydrogen.

In still other aspects, the overall process time may be reduced by performing the deposition of the dielectric cap material immediately after the hydrogen based cleaning and the desired diffusion and thus surface modification caused by the silicon-containing precursor material. The deposition may be initiated by igniting a plasma while discontinuing supply of hydrogen, wherein the supply of hydrogen may be discontinued after the thermally driven cleaning process, if a lower modification rate, i.e., a lower creation rate for the copper silicon compound, is desired.

Figure 2A:
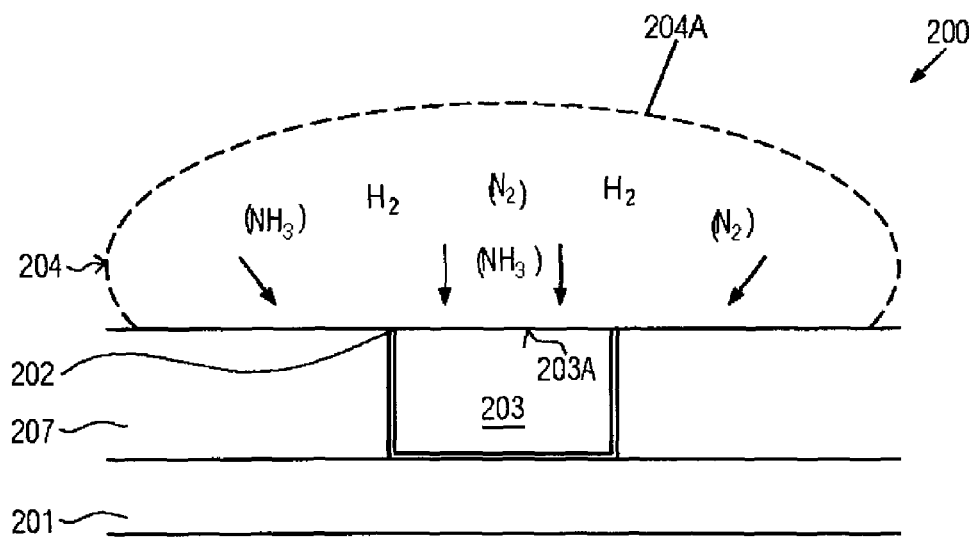
FIGS. 2a-2g schematically show cross-sectional views of the formation of a capping layer for a copper based metal region on the basis of a thermal-chemical pre-treatment including a surface modification on the basis of silane according to illustrative embodiments disclosed herein.

FIG. 2a schematically shows a semiconductor device 200 in cross-sectional view in an advanced manufacturing stage. The semiconductor device 200 may represent a device comprising circuit elements, such as transistors, possibly in combination with other microstructural features for forming mechanical and/or optical components. The device 200 may comprise a substrate 201, which may be provided in the form of a bulk silicon substrate, a silicon-on-insulator (SOI) substrate, or any other appropriate semiconductive or insulating carrier material having formed thereon an appropriate semiconductor layer for the formation of circuit elements. For convenience, any such circuit elements are not shown. Moreover, the device 200 may comprise one or more metallization layers including copper based metal lines and vias, wherein, for convenience, a single metallization layer 207 is shown in FIG. 2a. The metallization layer 207 may be comprised of any appropriate dielectric material including one or more copper based metal regions 203, wherein the copper based metal region 203 may represent a metal line embedded in the dielectric material of the layer 207, which may be provided in the form of silicon dioxide, fluorine doped silicon dioxide, a low-k dielectric material, such as SiCOH, polymer materials or any combination thereof. In highly advanced devices, the layer 207 may be comprised of a porous low-k material or a so-called ultra low-k dielectric material having a dielectric constant of 2.8 and less. The copper based metal region 203 may comprise a barrier layer 202 formed of any appropriate barrier/adhesion material, such as tantalum, tantalum nitride, titanium, titanium nitride, any combination thereof or any other appropriate materials. Moreover, the barrier layer 202 may be comprised of two or more individual layers of different material composition. The remaining conductive material of the region 203 may be comprised of copper or a copper alloy. The device 200 is shown in a manufacturing sequence, wherein a surface 203A is exposed and is to receive a dielectric barrier or cap layer. Due to any preceding processes, the exposed surface 203A may comprise a plurality of unwanted surface irregularities, such as oxidized, discolored and eroded portions, which are for convenience not shown in FIG. 2a.

A typical process flow for forming the device 200 as shown in FIG. 2a may comprise substantially the same processes as are previously described with reference to the device 100. That is, well-established process techniques may be used for forming any circuit elements and other microstructural features, followed by well-established single or dual damascene techniques for forming the metallization layer 207. During the process sequence for forming the metallization layer 207, the surface 203A of the copper based region 203 may have been exposed, for instance by CMP, so as to provide the copper based region 203 as an electrically insulated conductive region. Subsequently, the device 200 may be treated in a specified environment 204 so as to prepare the exposed copper containing surface 203A for receiving a capping layer thereon having a high resistance against electromigration. The specified environment 204 may, in one illustrative embodiment, be established by creating a gaseous atmosphere 204A containing hydrogen and surrounding the exposed surface 203A, wherein the specified environment 204 and thus the ambient 204A is established in the absence of a plasma ambient, contrary to conventional strategies, in which the treatment of an exposed copper based surface includes a plasma treatment prior to the subsequent in situ cap layer deposition. In this phase, the environment 204 may therefore represent the hydrogen-containing gaseous ambient 204A established for cleaning the exposed surface 203A. In one illustrative embodiment, the ambient 204A may be established by supplying substantially pure hydrogen substantially without supplying any further process gases. In other embodiments, at least one further nitrogen-containing process gas may be supplied in combination with the hydrogen gas, thereby "diluting" the hydrogen gas and/or adding additional thermally activated components to the ambient 204A so as to reduce contaminants from the surface 203A. For example, nitrogen may be supplied or nitrogen and ammonia ($NH_3$) may supplied in addition to the hydrogen. The chemical reaction is then thermally initiated by maintaining the substrate 201 and hence the surface 203A at a desired temperature in the range of approximately 250-500° C.

It should be noted that the specified environment 204 at this phase, i.e., the ambient 204A, may be established in any appropriate process tool that enables a plasma based deposition, such as a PECVD tool available from Applied Materials known as Producer™. Thus, the environment 204 may be created during its various different process phases in the same process chamber, which is herein also referred to as in situ. Dependent on the substrate size and chamber geometries, the process parameters may be adjusted according to the teaching provided herein. In one illustrative embodiment, the ambient 204A is established on the basis of a mixture of ammonia ($NH_3$), nitrogen ($N_2$) and hydrogen, wherein a pressure of approximately 1-6 Torr, for example, approximately 3.0 Torr, is created. Moreover, the flow rates for ammonia, nitrogen and hydrogen for the above-specified deposition tools may range from approximately 100-3000 sccm, for example, approximately 1500 sccm, approximately 0-10000 sccm, for example, approximately 5000 sccm, and approximately 50-5000 sccm, for example, approximately 500 sccm, respectively.

In other embodiments, a mixture of nitrogen and hydrogen may be used in the ambient 204A, wherein, for the above-specified hydrogen flow rate of approximately 50-5000 sccm, a flow rate of approximately 500-10000, for example, approximately 5000 sccm, may be used for nitrogen.

In a further embodiment, hydrogen may be supplied as the only process gas for establishing the ambient 204A, wherein the above-specified hydrogen flow rates may be used.

Moreover, the substrate 201 may be heated to approximately 250-500° C., for instance, approximately 350° C., thereby also heating the exposed surface 203A. Upon the interaction of the gas mixture in the ambient 204A, a thermally induced chemical cleaning process of the surface 203A is achieved, while a high degree of selectivity reduces damage at exposed portions of the dielectric layer 207. In illustrative embodiments, this step of pre-treatment is performed for approximately 5-60 seconds, for instance, for approximately 10 seconds.

Figure 2B:
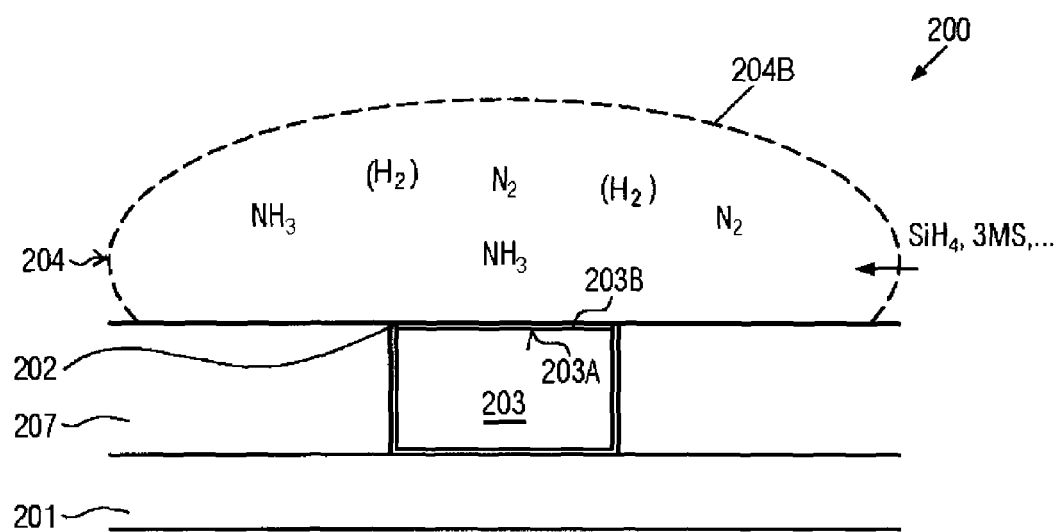

FIG. 2b schematically shows the semiconductor device 200 in a further advanced stage of the thermal-chemical pre-treatment of the exposed surface 203A in the absence of a plasma ambient. In this stage, silane ($SiH_4$) or 3MS, or other appropriate silicon-containing precursor, such as 4MS, for modifying the exposed surface 203A may be introduced into the specified environment 204, thereby creating an ambient 204B for modifying the cleaned surface 203A. The silicon-containing precursor, such as silane or 3MS and the like, may diffuse into the copper of the surface 203A, wherein the degree of diffusion and thus generation of silicon and nitrogen containing copper compounds is efficiently controllable by adjusting the process parameters of the ambient 204B, which is believed to reside in the fact of the absence of plasma or RF or LF (low frequency) power. The modification of the exposed surface 203A may therefore result in a modified layer 203B including copper silicide and possibly nitrogen-containing copper silicide. For controllably modifying the surface 203A for creating the layer 203B, substantially the same parameter values may be used as described above for the chemical treatment, while additionally silane, 3MS and the like is supplied to the ambient 204B. An appropriate concentration of the silicon-containing precursor may be achieved with the above-indicated deposition tool by selecting the flow rate of the silicon-containing precursor, such as silane, 3MS and the like, to be approximately 5-300 sccm, for example, approximately 50 sccm. In some illustrative embodiments, the process parameters of the ambient 204A may be maintained when the silicon-containing precursor may be added. In other embodiments, the supply of hydrogen may be discontinued for establishing the ambient 204B when a mixture of process gases has been used for establishing the ambient 204A. In this case, the degree of modification, i.e., the amount of CuSi, may be reduced, since the hydrogen may typically promote the creation of CuSi. Based on the above parameter values, the modification in the ambient 204B may be performed for approximately 1-30 seconds, for instance, for approximately 5 seconds.

Figure 2C:
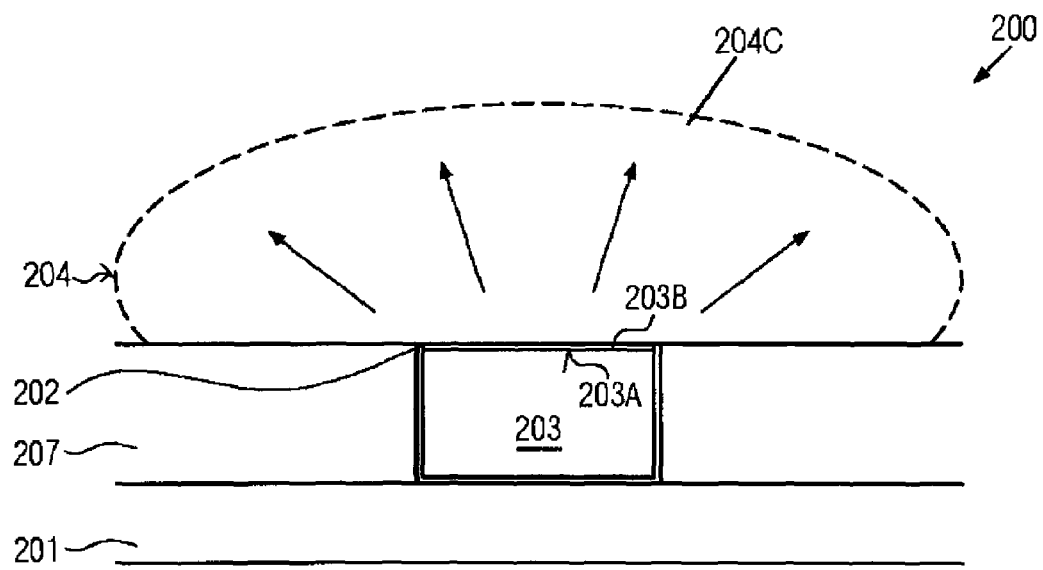

FIG. 2c schematically illustrates the semiconductor device 200 in a further advanced stage after the modification for forming the layer 203B according to illustrative embodiments. In this step, the device 200 may be exposed to an ambient 204C in the environment 204 to create a first phase of a pre-deposition ambient. In one embodiment, the ambient 204C is established to be appropriate to remove gas residuals and gaseous byproducts resulting from the preceding modification process. The ambient 204C may be established by discontinuing the supply of process gases and pumping the process chamber for efficiently removing unwanted gaseous components. In one illustrative embodiment, the pumping step may be performed for approximately 3-15 seconds, for example, for approximately 5 seconds, wherein a temperature of the substrate 201 may be maintained within the above-specified range.

Figure 2D:
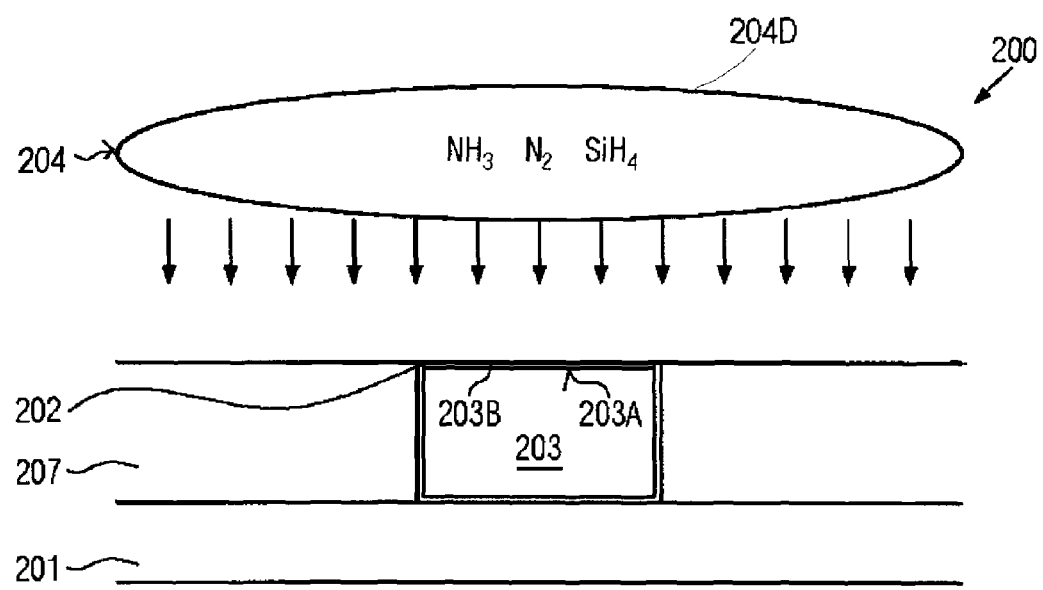

FIG. 2d schematically shows the semiconductor device 200 in a further advanced stage according to further illustrative embodiments, wherein the device 200 is exposed to a second phase of the pre-deposition ambient, indicated as 204D, wherein the pre-deposition ambient 204D is also established without generating a plasma. The ambient may be established by supplying appropriate process gases including a silicon-containing precursor material for forming a silicon/carbon/nitrogen layer and/or a silicon/carbon layer and/or a silicon nitride layer. For example, when forming a silicon/carbon/nitrogen layer, also referred to as an SiCN layer, ammonia, 3MS and helium may supplied as process gases. For the above-specified PECVD process tool, flow rates of approximately 200-1500 sccm, for instance, 800 sccm, approximately 100-500 sccm, for instance, 300 sccm, and approximately 200-1500 sccm, for instance, 1000 sccm, may be used for ammonia, 3MS and helium, respectively. The process pressure may be in the range of approximately 2-5 Torr, for instance, approximately 3 Torr.

In another example, when forming a silicon nitride layer, ammonia, nitrogen and silane ($SiH_4$) may be supplied as process gases. For the above-specified PECVD process tool, flow rates of approximately 300-1000 sccm, for instance, approximately 520 sccm, approximately 10000-25000 sccm, for instance, approximately 17000 sccm, and approximately 100-500 sccm, for instance, approximately 300 sccm, may be used for ammonia, nitrogen and silane, respectively. The process pressure may be in the range of approximately 3-6 Torr, for instance, approximately 4.8 Torr.

The duration of the process step for "stabilizing" the ambient 204D for the subsequent creation of a plasma may be approximately 15-30 seconds, for instance, approximately 20 seconds.

In one illustrative embodiment, the process steps performed on the basis of the ambients 204C and 204D, as shown in FIGS. 2c and 2d, may be combined to a single "setup" step. In this case, the pumping may be omitted and the pre-deposition ambient may be established immediately after the modification process performed on the basis of the ambient 204B. In this respect, "immediately after" the modification process is to be understood that the pre-deposition ambient, such as the ambient 204D of FIG. 2d, is established after a defined period of creating a copper/silicon compound and supplying the process gases required for the subsequent deposition without any intermediate steps. The setup step may be performed for approximately 3-30 seconds, for instance, for approximately 10 seconds.

Figure 2E:
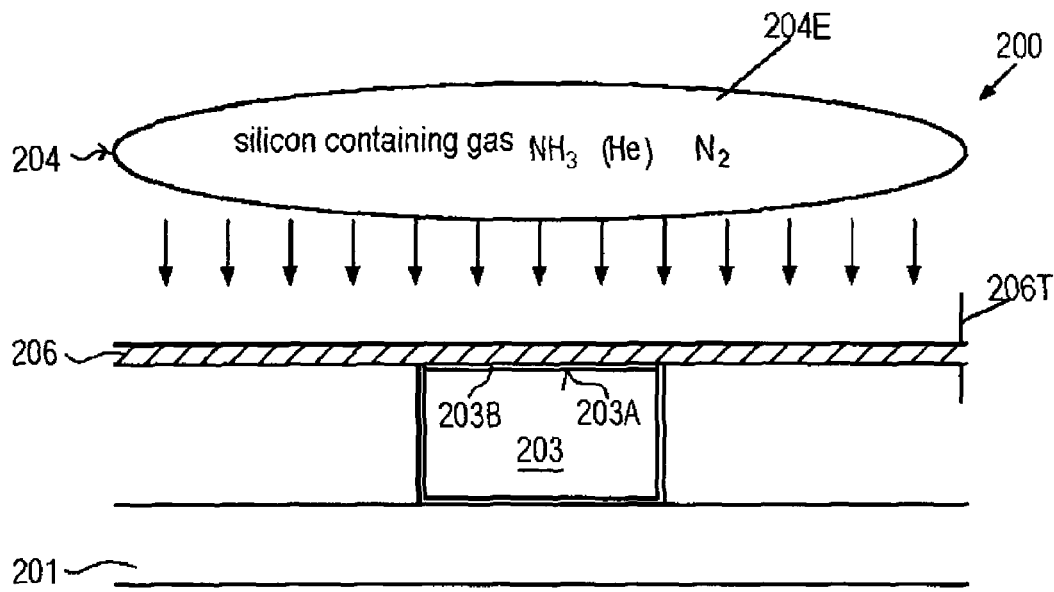

FIG. 2e schematically illustrates the device 200 when exposed to a deposition ambient 204E established in the environment 204 for forming a silicon based dielectric cap layer 206. In this phase, the ambient 204E may substantially correspond to the ambient 204D with respect to the process parameters except for respective process parameters for generating a plasma in the ambient 204E. The deposition plasma may be established so as to initiate the actual deposition process for forming the silicon based cap layer 206 with a desired thickness 206T in the range of approximately 50-2000 Å, wherein the layer 206 may represent an SiCN layer in one illustrative embodiment. The thickness 206T may be adjusted by controlling respective process parameters for establishing the deposition plasma ambient 204E. The radio frequency power for establishing the deposition plasma ambient 204E may range from approximately 400-800 watts, for example, approximately 600 watts. It should be appreciated that an appropriate power density for establishing a plasma for other tool geometries and chamber configurations may be readily determined on the basis of the RF power specified before. With the values for the temperature, the flow rates and the pressure as specified above as illustrative examples, a value of approximately 50 nm for the thickness 206T may be achieved with a deposition time of approximately 20 seconds.

After a target thickness for the layer 206 is achieved, the supply of RF power may be discontinued and a pump step may be performed for approximately 15 seconds, wherein any supply of gaseous components is discontinued.

As a consequence, the SiCN cap layer 206 may be formed with a thickness of, for instance, approximately 5-200 nm, wherein an interface, which for convenience is also referred to as 203B, with the copper based region 203 exhibits excellent characteristics with respect to adhesion and electromigration, wherein, additionally, a significant reduction of process time may be achieved compared to conventional cap layer formation sequences comprising a plasma based pre-treatment.

In another illustrative embodiment, the deposition ambient 204E may be configured for initiating the in situ deposition of the cap layer 206 comprised of silicon nitride (SiN). In this case, the process gases silane, ammonia and nitrogen may be used in the pre-deposition ambient 204D, as previously explained, in order to prepare the conditions for igniting a plasma to establish the deposition ambient 204E. The plasma may be established in the deposition ambient 204E for the above-specified deposition tool with an RF power between approximately 600-1700 watts, for example, approximately 1000 watts, and a deposition time of approximately 10 seconds, using the exemplary values for temperature, pressure and flow rates as specified above for the respective pre-deposition ambient 204D for silicon nitride, thereby obtaining a thickness of approximately 50 nm. Thereafter, a final pump step, for instance for approximately 15 seconds, may be performed, thereby removing any unwanted deposition byproducts. Similarly, as explained with reference to the silicon carbon nitride capping layer, the SiN cap layer 206 also has the improved modified layer and thus interface 203B, which exhibits a significantly enhanced resistance against electromigration effects compared to a conventionally formed SiN cap layer.

In other illustrative embodiments, the cap layer 206 may be formed on the basis of the cleaning process based on the ambient 204A and the modification process based on the ambient 204B without using the processes performed on the basis of the ambient 204C (FIG. 2c) and the ambient 204D (FIG. 2d). In this case, the deposition ambient 204E may be immediately established after the modification process performed on the basis of the ambient 204B, that is, after creating a desired amount of a copper silicon compound in the ambient 204B after cleaning the surface 203A in the hydrogen-containing ambient 204A, wherein these ambients may be established on the basis of a mixture of nitrogen and ammonia. In the ambient 204A, hydrogen is also supplied to obtain the desired cleaning effect, as previously explained. For creating the respective ambient 204A, the same process parameters may be used as previously described. Similarly, the ambient 204B may be established on the basis of the process parameter values as described above, wherein, in one embodiment, the hydrogen supply may be discontinued in the ambient 204B, when a reduced amount of the copper silicon compound is desired. Thereafter, the deposition ambient 204E may be created on the basis of the ambient 204B without any intermediate steps. That is, an appropriate excitation power may be supplied to obtain the desired plasma for depositing the desired material for the layer 206, such as silicon nitride, silicon carbon nitride, silicon carbide or any mixture of respective layers thereof. For this purpose, the same parameter values as given above may be used, depending on the type of material to be deposited. The process parameters during the deposition 204E may be the same as during the preceding modification in the ambient 204B, except for the hydrogen flow rate, which may have to be discontinued when establishing the deposition ambient 204E, irrespective of whether or not hydrogen is supplied into the ambient 204B.

Figure 2F:
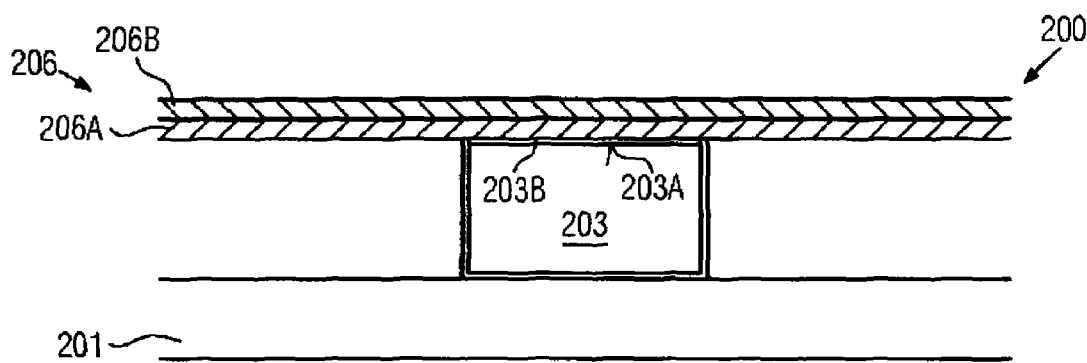

FIG. 2f schematically shows the semiconductor device 200 in accordance with still further illustrative embodiments, wherein the cap layer 206 comprises a first sub-layer 206A and a second sub-layer 206B. For example, the sub-layer 206A may be comprised of silicon nitride, while the sub-layer 206B may be comprised of nitrogen enriched silicon carbide. In other embodiments, the sub-layer 206A may be comprised of SiCN, while the sub-layer 206B may be comprised of silicon nitride. The cap layer 206 as shown in FIG. 2f may be formed on the basis of the process sequences described above with reference to FIGS. 2a-2e, wherein a thermal-chemical pre-treatment is performed in the ambient 204A containing hydrogen and without applying any plasma, wherein, in one illustrative embodiment, the pre-treatment is performed as is described with reference to FIGS. 2a and 2d. After a desired target thickness for the sub-layer 206A provided in the form of a silicon nitride layer is achieved, the supply of RF power may be discontinued and the plasma ambient 204E may be changed so as to initiate the deposition of the sub-layer 206B in the form of an SiCN layer.

Similarly, the above-described process sequence may be inverted with respect to the steps performed after the cleaning and modifying process described with reference to FIGS. 2a-2d so as to form an SiCN/SiN layer stack. In still other illustrative embodiments, one of the sub-layers 206A, 206B may be comprised of silicon carbide, which may be formed during the deposition 204E on the basis of appropriate precursor materials, while the cleaning and modification may be performed on the basis of the ambients 204A, 204B as previously described.

Figure 2G:
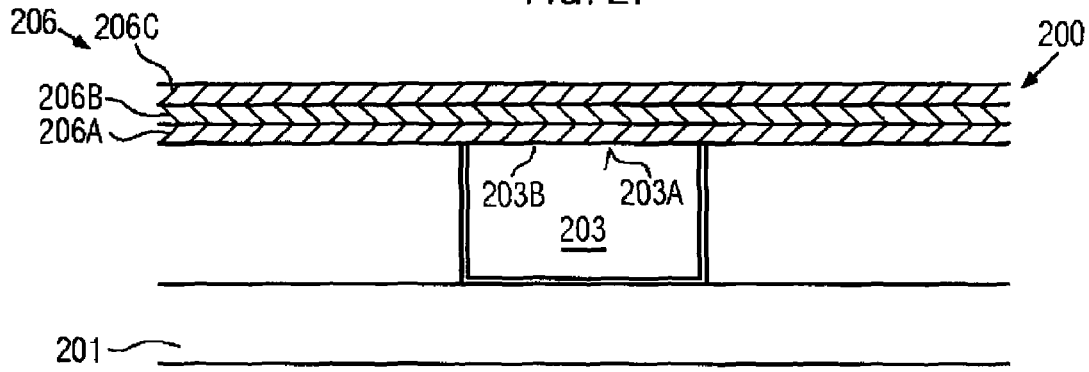

FIG. 2g schematically shows the semiconductor device 200 according to a further illustrative embodiment, wherein the cap layer 206 may include three sub-layers 206A, 206B and 206C. For example, the sub-layers 206A and 206C may represent SiCN layers, while the sub-layer 206B may represent an SiN layer. In other embodiments, the sub-layers 206A and 206C may represent SiN layers while the sub-layer 206B may represent an SiCN layer. Similarly, one or two of the sub-layers 206A, 206B and 206C may be comprised of silicon carbide, while the remaining sub-layer(s) may be comprised of silicon nitride and/or SiCN. Regarding the formation of the capping layer 206 as shown in FIG. 2g, the same processes may be used as described with reference to FIG. 2f, wherein, additionally, a further plasma-based deposition ambient may be established to form the additional sub-layer 206C. However, contrary to the embodiments of FIG. 2f, in FIG. 2g, the thickness of the individual sub-layers 206A, 206B and 206C may appropriately be selected so as to achieve a desired total thickness of the cap layer 206 in accordance with device requirements. Thus, the sub-layers 206A, 206B and 206C may in general have a reduced thickness compared to the sub-layers 206A and 206B of FIG. 2f for the semiconductor device 200 having otherwise substantially the same configuration. The described process sequence may be extended to form more than three sub-layers in the cap layer 206.

As a result, the present disclosure provides an improved technique for forming a dielectric barrier or cap layer for copper based metal regions as are typically encountered in highly sophisticated semiconductor devices including a highly conductive copper based metallization layer. Contrary to conventional approaches, a high quality interface between the copper-based metal and a cap layer is achieved by a thermal-chemical pre-treatment based on hydrogen prior to the subsequent in situ deposition of the cap layer. This effect is caused by a controllable silicon diffusion into a copper-based metal region prior to the actual deposition, thereby forming a modified surface layer. Subsequently, an interface of extremely high mechanical stability is formed after the deposition of the cap layer. On the other hand, a diffusion into the copper bulk and subsequently a non-desired modification of the copper line, such as silicide formation in the deeper lying copper volume, may be avoided by the new art of pre-treatment. Investigations seem to indicate that a significantly enhanced resistance against electromigration may be obtained, that may result in an approximately 3-5 times improved electromigration performance in terms of lifetime compared to a conventional SiCN cap layer formed on the basis of an RF plasma ambient. Furthermore, a good adhesion of the capping layer on the copper-based metal may be achieved. In addition to the enhanced electromigration performance, the generation rate of copper hillocks is significantly reduced, because no RF power is heating the uncapped copper surface during the pre-treatment, which is a characteristic of the conventional art of pre-treatment. Also, damage of exposed dielectric surfaces may be reduced, thereby making the hydrogen-based cleaning followed by the surface modification a viable technique for using porous and ultra low-k dielectrics. As an additional benefit, a significant reduction of process time is also achieved, thereby increasing throughput and reducing production cost.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a copper based metal region in a dielectric layer of a metallization layer of a semiconductor device, said copper based metal region having an exposed surface;
   cleaning said exposed surface by means of a thermal-chemical treatment performed in a hydrogen-containing gaseous ambient, wherein the thermal-chemical treatment is thermally initiated in the absence of a plasma by heating said copper based metal region;
   modifying the cleaned surface in a thermal treatment on the basis of a silicon-containing precursor to form a modified surface comprising copper silicide, wherein said modification is performed in the absence of a plasma; and
   depositing a dielectric cap layer on said modified surface.

2. The method of claim 1, wherein depositing said cap layer is performed in situ with said modifying of the cleaned surface by establishing a plasma immediately after modifying the cleaned surface.

3. The method of claim 1, wherein said cap layer is deposited on the basis of a silicon-containing precursor material.

4. The method of claim 1, wherein said hydrogen-containing gaseous ambient is established by supplying hydrogen and at least one nitrogen-containing gas into said gaseous ambient in the absence of a plasma.

5. The method of claim 4, wherein a supply of hydrogen is discontinued after modifying said cleaned surface.

6. The method of claim 4, further comprising supplying an inert carrier gas other than nitrogen into said gaseous ambient.

7. The method of claim 6, wherein said inert carrier gas comprises helium and said cap layer is deposited on the basis of 3MS.

8. The method of claim 1, wherein modifying said cleaned surface and depositing said cap layer are performed on the basis of the same process parameters except for a supply of hydrogen.

9. The method of claim 3, wherein said silicon-containing precursor gas comprises at least one of silane, 3MS (tri-methyl silane) and 4MS (tetra-methyl silane), and wherein a degree of diffusion of the silicon-containing precursor into the exposed surface is controlled by adjusting process parameters of the silicon-containing precursor gas in the absence of a plasma.

10. A method for forming a dielectric cap layer in situ, the method comprising:
    cleaning an exposed surface of a copper based metal region in a dielectric layer of a metallization layer of a semiconductor device by means of a thermal-chemical treatment performed in a hydrogen-containing gaseous ambient, wherein the thermal-chemical treatment is thermally initiated in the absence of a plasma by heating said copper based metal region;
    modifying the cleaned surface in a thermal treatment on the basis of a silicon-containing precursor to form a modified surface comprising copper silicide, wherein said modification is performed in the absence of a plasma;
    establishing a pre-deposition ambient including a silicon-containing precursor gas in the absence of a plasma, and depositing the dielectric cap layer on said modified surface in said pre-deposition ambient by generating a plasma therein.

11. The method of claim 10, wherein said hydrogen-containing gaseous ambient is established by supplying hydrogen as the only process gas.

12. The method of claim 10, wherein said hydrogen-containing gaseous ambient is established by supplying hydrogen and at least one further process gas in the absence of a plasma.

13. The method of claim 12, wherein said at least one further process gas comprises at least one of nitrogen and ammonia ($NH_3$).

14. The method of claim 10, wherein a supply of hydrogen is discontinued when modifying said cleaned surface.

15. The method of claim 10, wherein establishing said pre-deposition ambient comprises discontinuing supply of process gases and reducing residues of said process gases by pumping.

16. The method of claim 15, further comprising supplying process gases for establishing said pre-deposition ambient for a specified time period for stabilizing said pre-deposition ambient.

17. The method of claim 10, wherein establishing said pre-deposition ambient comprises discontinuing the supply of hydrogen and supplying process gases for said pre-deposition ambient without performing an intermediate pump process.

18. A method, comprising:
    providing a semiconductor device comprising a substrate having formed thereon a copper based metal region having an exposed surface;
    pre-treating said exposed surface in the absence of a plasma ambient to prepare said exposed surface for receiving a capping layer, said pre-treating comprising performing a surface cleaning process in a hydrogen-containing gaseous ambient and performing a surface modification process on the basis of a silicon-containing precursor to form a modified surface comprising copper silicide, and wherein the surface cleaning process is thermally initiated in the absence of a plasma by heating the copper based metal region; and
    depositing in situ said cap layer in the presence of a deposition ambient and a plasma.

19. The method of claim 18, wherein said cap layer is deposited immediately after said surface modification process without an intermediate process step for establishing a pre-deposition ambient.

20. The method of claim 19, wherein depositing said cap layer comprises discontinuing supply of hydrogen gas to said deposition ambient.

21. The method of claim 18, wherein pre-treating said exposed surface comprises establishing a pre-deposition ambient in the absence of a plasma after performing said surface modification process.

22. The method of claim 21, further comprising discontinuing supply of process gases and performing a pump step prior to establishing said pre-deposition ambient.

* * * * *